United States Patent [19]

Kawagai et al.

[11] 4,122,360

[45] Oct. 24, 1978

[54] LOGIC CIRCUIT USING CMOS TRANSISTORS

[75] Inventors: Kenji Kawagai; Shigeki Yoshida, both of Kawasaki, Japan

[73] Assignee: Tokyo Shibaura Electric Company, Limited, Tokyo, Japan

[21] Appl. No.: 820,118

[22] Filed: Jul. 29, 1977

[30] Foreign Application Priority Data

Aug. 3, 1976 [JP] Japan .................................. 51-92453

[51] Int. Cl.² ..................... H03K 19/08; H03K 19/40; H03K 19/20; H03K 17/04
[52] U.S. Cl. .................................... 307/205; 307/214; 307/215; 307/218; 307/251; 307/270
[58] Field of Search ............... 307/205, 213, 214, 215, 307/218, 251, 304, 270

[56] References Cited

U.S. PATENT DOCUMENTS

| | | | |
|---|---|---|---|
| 3,737,673 | 6/1973 | Suzuki | 307/205 |
| 3,855,549 | 12/1974 | Heuner et al. | 307/214 X |
| 3,956,880 | 5/1976 | O'Connor | 307/251 X |

OTHER PUBLICATIONS

Lohman, "Applications of MOS FET's in Microelectronics"; *SCP and Solid-State Technology* (pub.) pp. 23-29, Mar. 1966.

*Primary Examiner*—Larry N. Anagnos
*Attorney, Agent, or Firm*—Oblon, Fisher, Spivak, McClelland & Maier

[57] ABSTRACT

A logic circuit using CMOS transistors, in which electrical power is supplied to a CMOS logic circuit that is formed of P-channel type and N-channel type MOS transistors by way of a depletion type MOS transistor. The output level with respect to the voltage of the power source that is used is set at some point by the design of the depletion-type MOS transistor.

7 Claims, 7 Drawing Figures

LOGIC CIRCUIT USING CMOS TRANSISTORS

BACKGROUND OF THE INVENTION

1. Field of the Invention

This invention relates to a logic circuit using complementary type Metal Oxide Semiconductor Insulated Gate Field Effect Transistors (hereafter referred to CMOS transistors).

2. Description of the Prior Art

In LSI (Large Scale Integrated Circuit), the shortening of the response time from the input of the signal to its output is extremely important in conjunction with the fact that computers are being made large and with the development of a 1 chip CPU (Central Processing Unit) and the like. In particular, this is due to the fact that the increase in the amount of information calls for an increase in the processing capacity of the computers processing this information.

On the other hand, in addition to this requirement, it has become possible to incorporate large systems in 1 chip LSI and therefore these are being operated by dry cells or the like and are being made light in weight and compact. In order to operate with a dry cell, it is necessary that the electrical power consumed by the LSI should be made low. Now, these two requirements contain mutually incompatible matter. That is to say, to make the response of the elements faster for a certain load capacity, the electric currents may be made to flow in larger quantities, but this involves an increase in the electrical power consumed by the LSI. Therefore it is important to obtain high speed elements with low power consumption. To meet this requirement it is necessary to reduce the load capacity.

Now, as regards the load capacity in a MOS circuit, there is the gate capacity of the inverter circuit in the next stage, the aluminum or other wiring capacity, the diffusion capacity and the like, but here it is important to reduce the diffusion capacity because it is difficult to reduce the gate capacity and the wiring capacity. In the SOS (Silicon On Sapphire) technique the diffusion junction area is reduced whereby reduction of the above-mentioned diffusion capacity is achieved. However in the SOS technique, the manufacturing process is very complicated and is difficult to practice.

BRIEF SUMMARY OF THE INVENTION

It is therefore an object of the present invention to provide a CMOS logic circuit which makes high speed operation possible with low power consumption.

It is a further object of the present invention to provide a CMOS logic circuit whose output level is set at any required point by the design of the depletion type transistors.

According to the present invention a logic circuit using CMOS transistors comprises: (a) first and second power sources, (b) a CMOS transistor circuit element in which N channel type MOS transistors and P channel type transistors are connected in complementary form, (c) a first depletion type MOS transistor connected between the first power source and the CMOS transistor circuit element, and a (d) second depletion type MOS transistor connected between the second power source and the CMOS transistor circuit element.

BRIEF DESCRIPTION OF THE DRAWINGS

The invention is illustrated by way of example in the accompanying drawings which form part of this application and in which.

DETAILED DESCRIPTION OF THE PREFERRED EMBODIMENT

Figure 1A:
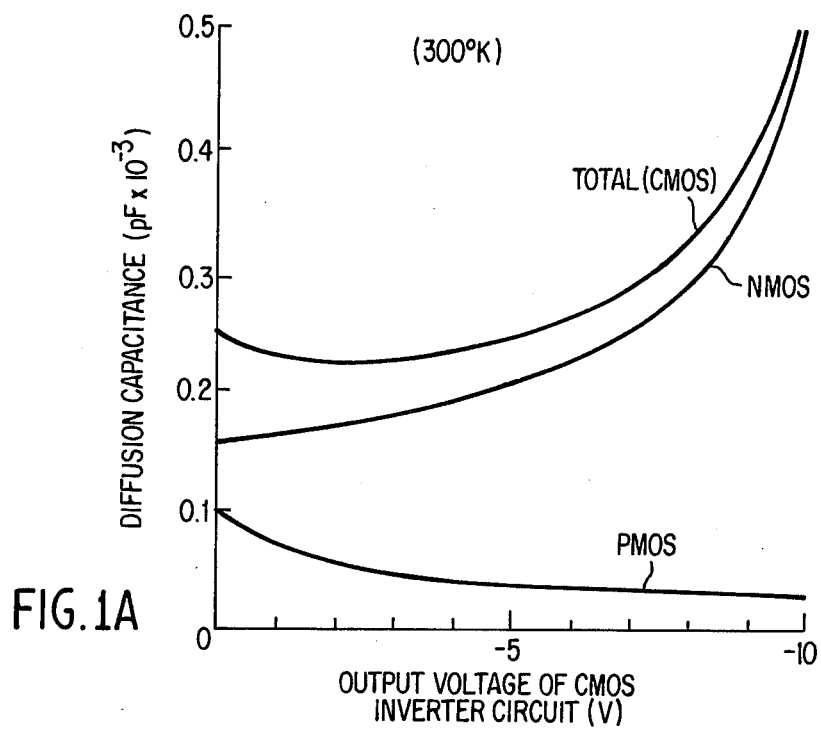
FIG. 1(A and B) shows a CMOS inverter circuit and a diagram of the characteristics of junction (diffusion) capacitances with respect to the output of the CMOS inverter circuit.

Referring now to the drawings wherein like reference numerals refer to identical or corresponding parts through the specification, a preferred embodiment according to this invention is illustrated.

Figure 1B:
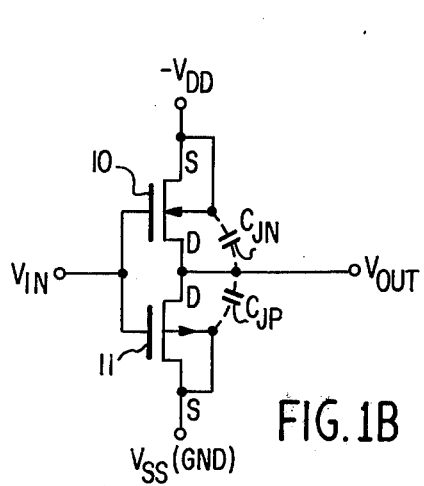

In the CMOS inverter circuit shown in FIG. 1 the diffusion capacity of the output portion (namely the drain regions of the P-channel type MOS transistor 11 and the N-channel type MOS transistor 10) increases as the output voltage approaches that of the power source. For example, when the power source voltage has appeared at the output by way of the N-channel type MOS transistor 10, this output voltage and the power source voltage are approximately equal. Therefore the bias applied to the diffusion capacity $C_{JN}$ (which is formed between the drain region and P-well region) of the N-channel type MOS transistor 10 is slight. When the ground voltage ($V_{SS}$) has appeared at the output by way of the P-channel type MOS transistor 11, this output voltage and the ground voltage are approximately equal and therefore the bias applied to the diffusion capacity $C_{JP}$ (which is formed between the drain region and N-channel type substrate) of the P-channel type MOS transistor 11 becomes slight. The thickness of the depletion layer at the junction is small and the difffusion capacity increases. Accordingly, if the output level is made to deviate from the voltage of the power source, the bias voltage applied to diffusion junctions becomes large and the diffusion capacity decreases. This results in high speed operation. As one method of doing this, another power source may be used and the bias of the P-well region and the bias of the N-channel type substrate may be made large compared with the power source. But as a practical matter, if the number of power sources is increased, it becomes difficult to make the LSI chip small.

Figure 2:
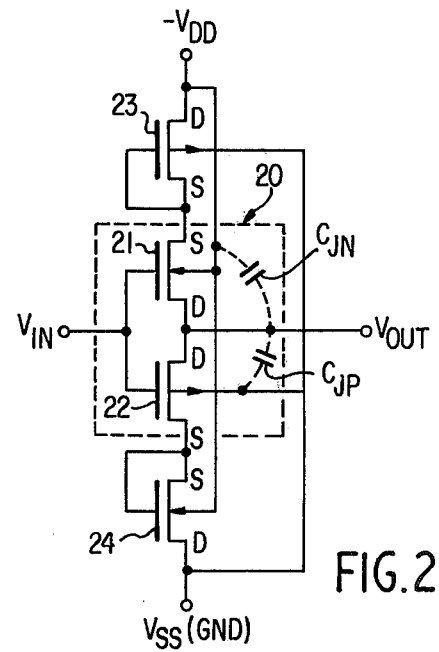
FIG. 2 is a circuit diagram showing an embodiment of the present invention.

This problem is eliminated by the embodiment of the present invention shown in FIG. 2. A CMOS transistor circuit element, namely an inverter circuit 20 is formed which consists of an N-channel type MOS transistor 21 and a P-channel type MOS transistor 22 of the enhancement type in each case. The source electrode of a depletion-type P-channel type MOS transistor 23 is connected to the source electrode of the N-channel type MOS transistor 21, and the drain electrode of the depletion-type MOS transistor 23 is connected to a negative power source $-V_{DD}$. Also, the source electrode of a P-channel type MOS transistor 22 is connected to the source electrode of a depletion-type N-channel type MOS transistor 24, and the drain electrode of the depletion-type MOS transistor 24 is connected to a power source $V_{SS}$ (for example, ground). The gate electrodes of the depletion-type transistors 23 and 24 are respectively connected to their own source electrodes, the substrate electrodes of the N-channel type transistors 21 and 24 are connected to the power source $-V_{DD}$ and the substrate electrodes of the P-channel type transistors 22 and 23 are connected to the power source $V_{SS}$.

Figure 3:
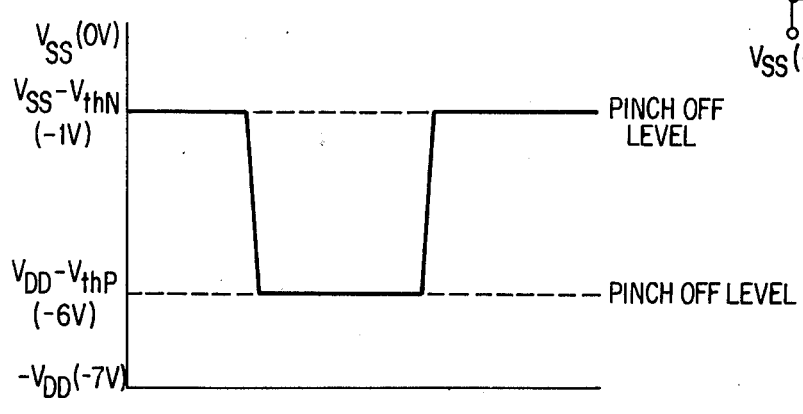
FIG. 3 is a diagram of the output voltage waveform of the circuit shown in FIG. 2.

In the drawing, $C_{JN}$ is the junction capacity of the N-channel type MOS transistor 21 and $C_{JP}$ is the junction capacity of the P-channel type MOS transistor 22. According to the circuit structure shown in FIG. 2, the level of the output $V_{out}$ is determined by the pinch-off point of the depletion type MOS transistors 23 and 24, and as shown in FIG. 3 an output waveform is obtained which is the inverse of the input waveform. The amplitude of the output waveform is within the voltage values of the power sources $-V_{DD}$ and $V_{SS}$. That is to say, the output level is set with the amplitude between the pinch-off levels of the depletion-type MOS transistors 23 and 24.

For instance, in a case in which power sources $-V_{DD} = -7V$, $V_{SS} = 0V$ are used, and the depletion-type MOS transistor 23 is pinched off at $-6V$ and the depletion-type MOS transistor 24 is pinched off at $-1(V)$, if $V_{out} = -7(V)$, namely the depletion type transistor 23 is omitted when the input $V_{in} = $ "0" and the transistor 21 is in its on state, then the voltage between the two ends of the capacitance $C_{JN}$ would become approximately 0 (V) so that $C_{JN}$ would finally become large. But according to this invention, $V_{out} = -6(V)$ (which is the pinch-off voltage of the depletion-type MOS transistor 23) and therefore the voltage between the two ends of the capacitance becomes about 1(V) so that $C_{JN}$ becomes smaller. Also, if $V_{out} = 0(V)$, namely the depletion-type transistor 24 is omitted when the input $V_{in} = $ "1" and the transistor 22 is in its on state, then the voltage between the two ends of the capacitance $C_{JP}$ would become approximately 0(V) so that $C_{JP}$ would finally become large. But, according to this invention, $V_{out} = -1(V)$ (which is the pinch-off voltage of the depletion-type MOS transistor 24) and therefore the voltage between the two ends of the capacitance becomes 1(V) so that $C_{JP}$ becomes small.

Accordingly, the output level with respect to the voltage of the power source that is used can be set at any required point by the design of the depletion-type transistors, and also the junction capacities which are a load on the output can be reduced.

Figure 4:
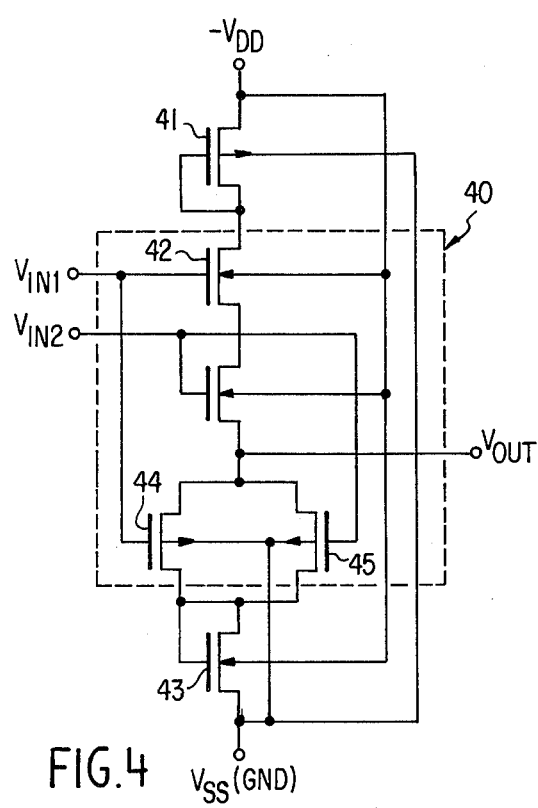
FIGS. 4 to 6 are circuit diagrams showing other embodiments of the present invention.
Figure 5:
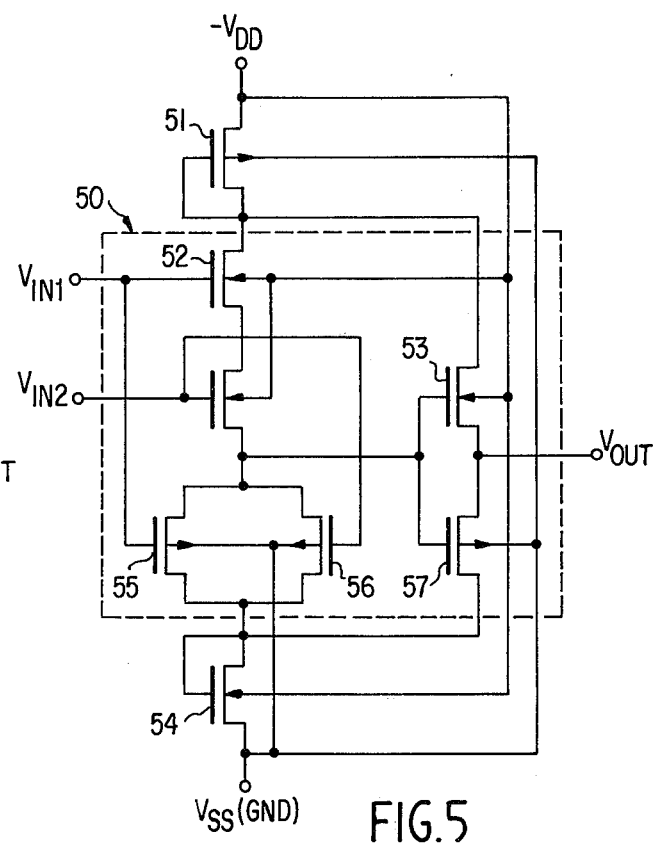

FIGS. 4 and 5 show other embodiments. In FIG. 4 CMOS circuit element 40 constitutes a NAND circuit. P-channel depletion-type MOS transistor 41 is connected to the source electrode of N-channel type MOS transistor 42 and N-channel depletion-type MOS transistor 43 is connected to the source electrodes of P-channel type transistors 44 and 45.

In FIG. 5, CMOS circuit element 50 constitutes an AND circuit. P-channel depletion type MOS transistor 51 is connected to the source electrodes of N-channel type transistors 52 and 53 and N-channel depletion type MOS transistor 54 is connected to the source electrodes of P-channel type transistors 55, 56 and 57.

Figure 6:
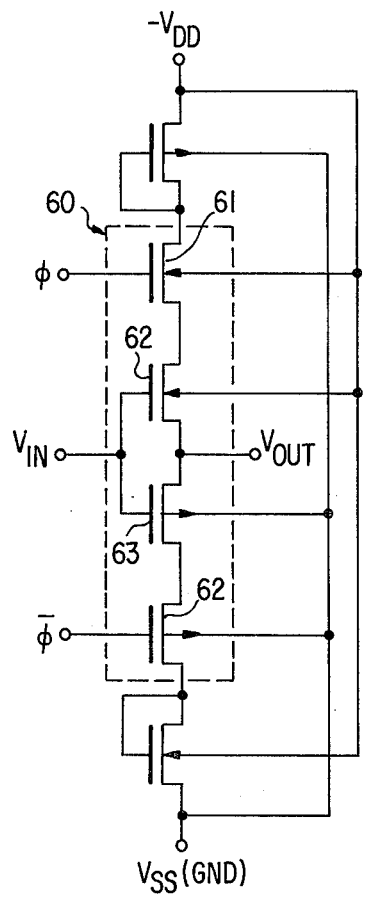

FIG. 6 shows a further alternate embodiment. In this embodiment CMOS circuit element 60 is a clocked inverter circuit, that is to say, N-channel type switching transistor 61 and P-channel type switching transistor 62 are respectively connected to the source electrodes of N-channel type transistor 62 and P-channel type transistor 63 which form an inverter circuit, and clock pluses $\phi$ and $\overline{\phi}$ are applied to the gate electrodes of transistors 61 and 62.

In these embodiments, only representative circuits are shown for the CMOS circuit element, so that it is possible to modify these circuits. Furthermore, it is possible to use only two depletion-type MOS transistors which are used in common for all CMOS circuit elements in one semiconductor chip.

Now, in the above embodiments the case in which a negative power source is used has been described, but the invention can of course also be applied in the case in which a positive source is used.

As described above, when the present invention is used, the diffusion capacity of the output regions can be reduced and therefore a logic circuit in which high speed operation is possible can be provided. Furtheremore, the output level with respect to the voltage of the power source that is used can be set at any required point by the design of the depletion-type transistors.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A logic circuit using MOS transistors comprising:
    (a) input and output terminals, said input terminal for receiving binary coded signals,
    (b) first and second power sources,
    (c) an inverter circuit element including at least one complementary pair of N-channel type and P-channel type MOS transistors, the gate electrodes of said MOS transistors being mutually connected together to the input terminal, the drain electrodes of said MOS transistors being connected together to the output terminal.
    (d) a first P-channel depletion-type MOS transistor connected between the first power source and the N-channel type MOS transistor, and
    (e) a second N-channel depletion type MOS transistor connected between the second power source and the P-channel type MOS transistor,
    the substrate electrodes of the P-channel MOS transistor and the first depletion-type MOS transistor being directly connected to the second power source, and the substrate electrodes of the N-channel type MOS transistor and the second depletion-type MOS transistor being directly connected to the first power source.

2. A circuit using CMOS transistors comprising:
    (a) a logic circuit element having an input terminal, an output terminal, and at least one complementary pair of N-channel and P-channel type MOS transistors, the gate electrode of the MOS transistors being mutually connected together to the input terminal;
    (b) a first depletion type MOS transistor;
    (c) a second depletion type MOS transistor;
    (d) means for connecting the first depletion type MOS transistor between the N-channel type MOS transistor and a first power source;
    (e) means for connecting the second depletion type MOS transistor between the P-channel type MOS transistor and a second power source;

(f) means for directly connecting the substrate electrodes of the P-channel MOS transistor and the first depletion-type MOS transistor to the second power source; and (g) means for directly connecting the substrate electrodes of the N-channel type MOS transistor and the second depletion-type MOS transistor to the first power source.

3. The circuit using CMOS transistors recited in claim 2 wherein:

the logic circuit element is an inverter circuit.

4. The circuit using CMOS transistors recited in claim 3 wherein:

the drain electrodes of the N-channel and P-channel type transistors are connected together to the output terminal;

the first depletion type MOS transistor is a P-channel depletion type MOS transistor; and the second depletion type MOS transistor is an N-channel depletion type MOS transistor.

5. The circuit using CMOS transistors recited in claim 2 wherein:

the logic circuit element is a NAND circuit.

6. The circuit using CMOS transistors recited in claim 2 wherein:

the logic circuit element is an AND circuit.

7. The circuit using CMOS transistors according to claim 2 wherein:

the logic circuit element is a clocked inverter circuit which comprises an inverter circuit formed of at least one complementary pair of N-channel and P-channel MOS transistors and two switching MOS transistors for controlling said inverter circuit upon receipt of clock pulses, one of said switching MOS transistors being an N-channel type and connected to an N-channel MOS transistor of the inverter circuit and the other being a P-channel type and connected to a P-channel MOS transistor of the inverter circuit.

* * * * *